United States Patent [19]
Tihanyi

[11] Patent Number: 5,900,775
[45] Date of Patent: May 4, 1999

[54] MOSFET WITH TEMPERATURE PROTECTION

[75] Inventor: Jenoe Tihanyi, Kirchheim, Germany

[73] Assignee: Siemens Aktiengesellschaft, Munich, Germany

[21] Appl. No.: 08/859,923

[22] Filed: May 21, 1997

[30] Foreign Application Priority Data

May 21, 1996 [DE] Germany ............................ 196 20 429

[51] Int. Cl.$^6$ ....................................................... G05F 1/10
[52] U.S. Cl. ........................... 327/543; 327/513; 327/538; 327/362
[58] Field of Search ..................................... 327/538, 513, 327/540, 362, 541, 543, 427, 434

[56] References Cited

U.S. PATENT DOCUMENTS 4,691,129  9/1987  Einzinger et al. ........................ 307/581

FOREIGN PATENT DOCUMENTS

4305038A1  8/1994  Germany .
4122653C2  4/1996  Germany .

*Primary Examiner*—Timothy P. Callahan
*Assistant Examiner*—Minh Nguyen
*Attorney, Agent, or Firm*—Herbert L. Lerner; Laurence A. Greenberg

[57] ABSTRACT

The MOSFET of the invention has a switching element connected between its gate and its source. The switching element causes a reduction of the gate-to-source voltage of the MOSFET. The switching element is driven via a diode, which is connected in the blocking direction between the drain of the MOSFET and a control terminal of the switching element.

6 Claims, 1 Drawing Sheet

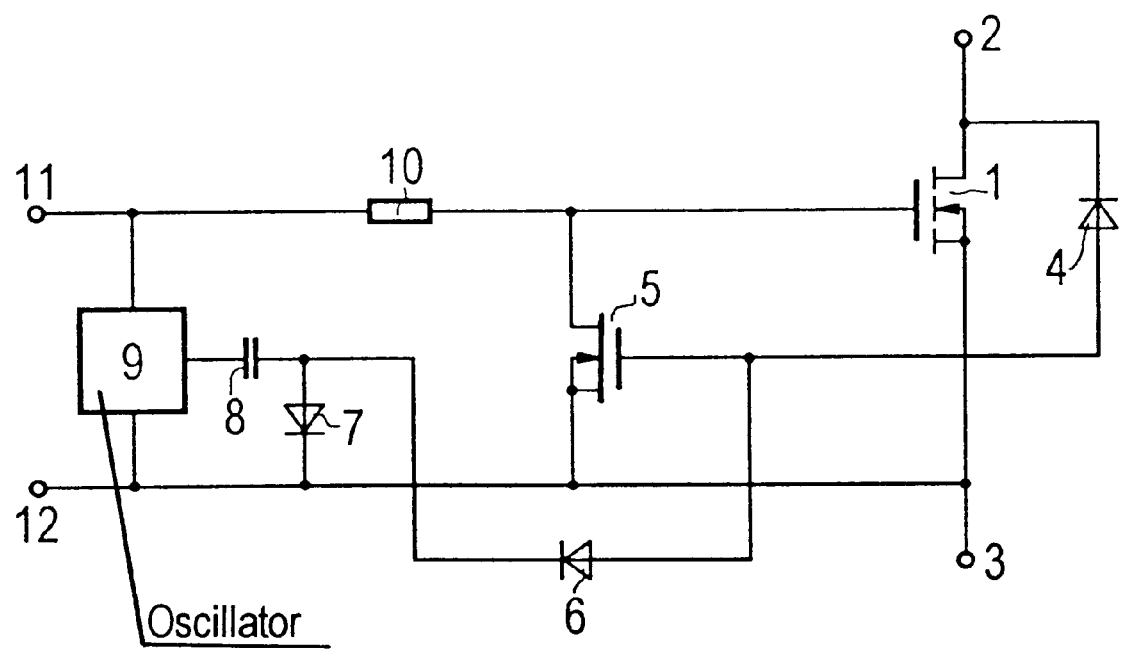

MOSFET WITH TEMPERATURE PROTECTION

BACKGROUND OF THE INVENTION

1. Field of the Invention

The invention relates to a MOSFET with temperature protection wherein a switching element is connected between a gate terminal and a source terminal of the MOSFET.

2. Description of the Related Art

Such a MOSFET with temperature protection is known, for instance, from German patent disclosure DE 43 05 038. The switching element of that disclosure connected between the gate and source electrodes switches the MOSFET off when a critical temperature is reached. A temperature-dependent signal is produced for this purpose which drives the switching element and which, when a temperature is reached below the critical temperature, short-circuits the gate and the source of the MOSFET via the load path of the switching element. This reduces the gate-to-source voltage of the MOSFET and thus the current flowing therethrough. The increase in temperature is accordingly slowed.

SUMMARY OF THE INVENTION

It is accordingly an object of the invention to provide a MOSFET with temperature protection, which overcomes the above-mentioned disadvantages of the heretofore-known devices and methods of this general type and which is simplified in terms of its temperature protection circuit.

With the foregoing and other objects in view there is provided, in accordance with the invention, a MOSFET with temperature protection, comprising:

a depletion MOSFET for reducing a gate-to-source voltage of the MOSFET connected between the gate and the source of the MOSFET; and a charge pump circuit connected to and driving the depletion MOSFET in a blocking direction in an on-state of the MOSFET.

It is an advantage of the present invention that only one diode is used as the temperature sensing element. The current through the diode which is temperature-independent is fed to the gate of a depletion MOSFET, which is blocked by a charge pump circuit in the switched-on condition of the main switch. The diode is integratable with the MOSFET. Advantageously with regard to the prior art, the function of the circuit configuration becomes independent of the drain-to-source voltage of the MOSFET.

In accordance with an added feature of the invention, the MOSFET is integrated on a chip, and the depletion MOSFET has a gate, a drain and a source; the assembly including a further diode which is integrated on the chip, the further diode having a cathode connected to the drain of the depletion MOSFET and an anode connected to the gate of the depletion MOSFET, and whereby, when a temperature of the chip rises, a blocking current of the further diode drives the depletion MOSFET against a charge pump current into the conducting state.

In accordance with an additional feature of the invention, the circuit configuration further comprises a series circuit of two diodes connected between the gate and the source of the depletion MOSFET, and a capacitor connected to a node of the series circuit of two diodes, and the charge pump circuit comprising an oscillator with an output connected through the capacitor to the node of the series circuit of two diodes.

In accordance with a further feature of the invention, the oscillator is a ring oscillator.

In accordance with a concomitant feature of the invention, the MOSFET and the diode are integrated on a first chip, and the charge pump circuit is integrated on a second chip.

Other features which are considered as characteristic for the invention are set forth in the appended claims.

Although the invention is illustrated and described herein as embodied in a MOSFET with temperature protection, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

BRIEF DESCRIPTION OF THE DRAWING

The sole FIGURE of the drawing is a circuit diagram.

DESCRIPTION OF THE PREFERRED EMBODIMENTS

Referring now to the FIGURE of the drawing in detail, a power MOSFET 1 has a drain, a gate, and a source. The drain of the power MOSFET 1 is connected to a terminal 2 and the source is wired to a terminal 3. The gate of the power MOSFET 1 is connected through a resistor 10 to a terminal 11. The load path of a depletion MOSFET 5 is connected between the gate of the power MOSFET 1 and its source. The gate of the depletion MOSFET 5 is connected through a diode 4 and to the drain of the power MOSFET 1. Furthermore, the gate of the depletion MOSFET 5 is connected through a series circuit formed with two diodes 6 and 7 and to the source of the power MOSFET 1. A further input terminal 12 is provided which is connected to the source of the power MOSFET 1. An oscillator 9 is connected in between the terminals 11 and 12. An output of the oscillator is connected through a capacitor 8 with a node of the series circuit formed of the two diodes 6 and 7. The oscillator operates when the input voltage is positive, i.e., in the on-state of the circuit.

The diode 4 is integrated together with the power MOSFET 1 and it is connected in the blocking direction. The diode 4 becomes a current source when the chip temperature rises and it pulls the gate of the depletion MOSFET 5 in positive direction against the charge pump current when it is in its so-called hot state.

When no signal is present between the terminals 11 and 12, i.e. the power MOSFET 1 is supposed to block, then no signal reaches the gate of the power MOSFET 1 and it is blocked. If, on the other hand, a signal is present at the terminal 11, then the signal reaches the gate of the power MOSFET 1 through the resistor 10 and the power MOSFET 1 conducts. The oscillator 9 is simultaneously activated and it produces a signal through the charge rectifier which consists of the capacitor 8 and the two diodes 6 and 7. The oscillator signal keeps the transistor 5 permanently blocked. If, however, the temperature in the power MOSFET 1 rises, then a current flows through the diode 4. That current through the diode 5 compensates the current which is produced by the oscillator 9 and the charge rectifier connected thereto The depletion transistor 5 thus becomes conducting and its load path reduces the gate voltage of the power MOSFET 1.

It is a particular advantage that the circuit configuration according to the invention works with any drain-to-source voltage of the power MOSFET 1 The circuit configuration according to the invention can therefore be realized in a single-chip embodiment or in a multi-chip embodiment, such as, for instance, in a two-chip version. Furthermore, the circuit can be combined with usual current limiters and overvoltage protection circuits, such as, for instance, with active Zener diodes.

The temperature protection circuit can also be realized with an additional, more sensitive temperature protection, for instance a latching temperature protection.

The oscillator 9 of the preferred embodiment should have low current consumption in the range <100 $\mu$A. The charge current through the diode 6 will thus also be in the microampere range. The diodes 6 and 7 can suitably be MOS diodes. One possibility for the oscillator 9, for instance, is a simple ring oscillator with buffer output.

I claim:

1. A circuit implemented on at least one integrated circuit chip for providing a MOSFET with temperature protection, comprising:

a MOSFET having a gate, a source and a drain;

a depletion MOSFET having a gate, a drain, and a source, said drain and said source of said depletion MOSFET connected between said gate and said source of said MOSFET for reducing a gate-to-source voltage of the MOSFET;

a charge pump circuit connected to and driving said depletion MOSFET in a blocking direction in an on-state of said MOSFET; and a further diode having a cathode connected to said drain of said MOSFET and an anode connected to said gate of said depletion MOSFET, and whereby, when a temperature of the at least one chip rises, a blocking current of said further diode drives said depletion MOSFET against a charge pump current into the conducting state.

2. The MOSFET according to claim 1, which further comprises a series circuit of two diodes connected between said gate and said source of said depletion MOSFET, and a capacitor connected to a node of said series circuit of two diodes, and said charge pump circuit comprising an oscillator with an output connected through said capacitor to the node of said series circuit of two diodes.

3. The MOSFET according to claim 2, wherein said oscillator is a ring oscillator.

4. The MOSFET according to claim 1, further including a series circuit of two diodes connected between said gate and said source of said depletion MOSFET, and a capacitor connected to a node of said series circuit of two diodes, and said charge pump circuit comprising an oscillator with an output connected through said capacitor to the node of said series circuit of two diodes.

5. The MOSFET according to claim 4, wherein said oscillator is a ring oscillator.

6. The MOSFET according to claim 1, wherein the MOSFET and said diode are integrated on a first chip, and said charge pump circuit is integrated on a second chip.

* * * * *